United States Patent
Kamigaichi

(10) Patent No.: US 9,202,559 B2
(45) Date of Patent: Dec. 1, 2015

(54) SEMICONDUCTOR MEMORY DEVICE AND METHOD OF CONTROLLING THE SAME

(71) Applicant: Kabushiki Kaisha Toshiba, Minato-ku (JP)

(72) Inventor: Takeshi Kamigaichi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/466,022

(22) Filed: Aug. 22, 2014

(65) Prior Publication Data
US 2015/0262658 A1    Sep. 17, 2015

Related U.S. Application Data

(60) Provisional application No. 61/951,615, filed on Mar. 12, 2014.

(51) Int. Cl.
G11C 16/04 (2006.01)
G11C 11/56 (2006.01)
G11C 5/06 (2006.01)

(52) U.S. Cl.
CPC .............. *G11C 11/5635* (2013.01); *G11C 5/06* (2013.01)

(58) Field of Classification Search
USPC ............................. 365/185.03, 185.28, 185.29
See application file for complete search history.

(56) References Cited

U.S. PATENT DOCUMENTS

| 6,522,580 | B2 | 2/2003 | Chen et al. |
| 7,239,556 | B2 | 7/2007 | Abe et al. |
| 8,233,324 | B2 | 7/2012 | Sharon et al. |
| 8,514,621 | B2 | 8/2013 | Choi et al. |
| 2011/0116300 | A1* | 5/2011 | Maejima ................. 365/148 |
| 2012/0236637 | A1 | 9/2012 | Nawata |

FOREIGN PATENT DOCUMENTS

| JP | 2003-109386 | 4/2003 |
| JP | 2005-235260 | 9/2005 |
| JP | 2011-253609 | 12/2011 |
| JP | 2012-190523 | 10/2012 |
| JP | 2013-524391 | 6/2013 |

\* cited by examiner

*Primary Examiner* — Hoai V Ho
(74) *Attorney, Agent, or Firm* — Oblon, McClelland, Maier & Neustadt, L.L.P.

(57) ABSTRACT

A semiconductor memory device according to an embodiment comprises: a plurality of memory cells; a word line; a plurality of first bit lines and a plurality of second bit lines; and a control circuit. The control circuit is capable of executing: a determining operation that determines whether the memory cell which is to be a write-target includes an erase-target cell whose threshold voltage is to be the erase state, or not; and an inverting operation that inverts selection or unselection of the bit line connected to one of the two memory cells adjacent to the erase-target cell, in the first write operation and the second write operation.

16 Claims, 7 Drawing Sheets

SEMICONDUCTOR MEMORY DEVICE AND METHOD OF CONTROLLING THE SAME

CROSS REFERENCE TO RELATED APPLICATION

This application is based on and claims the benefit of priority from prior U.S. Provisional Patent Application No. 61/951,615, filed on Mar. 12, 2014, the entire contents of which are incorporated herein by reference.

FIELD

Embodiments described in the present specification relate to a semiconductor memory device and a method of controlling the same.

BACKGROUND

In a nonvolatile semiconductor memory device such as a NAND type flash memory, a memory cell includes a control gate and a charge accumulation layer, and stores as data a magnitude of a threshold voltage of the memory cell that changes according to a charge accumulated in the charge accumulation layer. In such a semiconductor memory device, due to progress in miniaturization, interference of voltages sometimes occurs between adjacent bit lines during data write.

DETAILED DESCRIPTION

A semiconductor memory device according to an embodiment comprises: a plurality of memory cells that have a threshold voltage included in any of four or more kinds of threshold voltage distributions including an erase state, and that are configured to be capable of storing four or more levels of data; a word line commonly connected to the plurality of memory cells; and a plurality of first bit lines and a plurality of second bit lines that are electrically connected respectively to the plurality of memory cells and that are disposed alternately corresponding to arragement of the plurality of memory cells. In addition, said semiconductor memory device comprises a control circuit capable of executing a first write operation that selects the first bit line and renders the second bit line unselected and performs write of data to the memory cell connected to the first bit line and does not perform write of data to the memory cell connected to the second bit line, and a second write operation that selects the second bit line and renders the first bit line unselected and performs write of data to the memory cell connected to the second bit line and does not perform write of data to the memory cell connected to the first bit line. The control circuit is capable of executing: a determining operation that determines whether the memory cell which is to be a write-target includes an erase-target cell whose threshold voltage is to be the erase state, or not; and an inverting operation that inverts selection or unselection of the bit line connected to one of the two memory cells adjacent to the erase-target cell, in the first write operation and the second write operation.

Embodiments will be described in detail below with reference to the drawings.

First Embodiment

Figure 1:
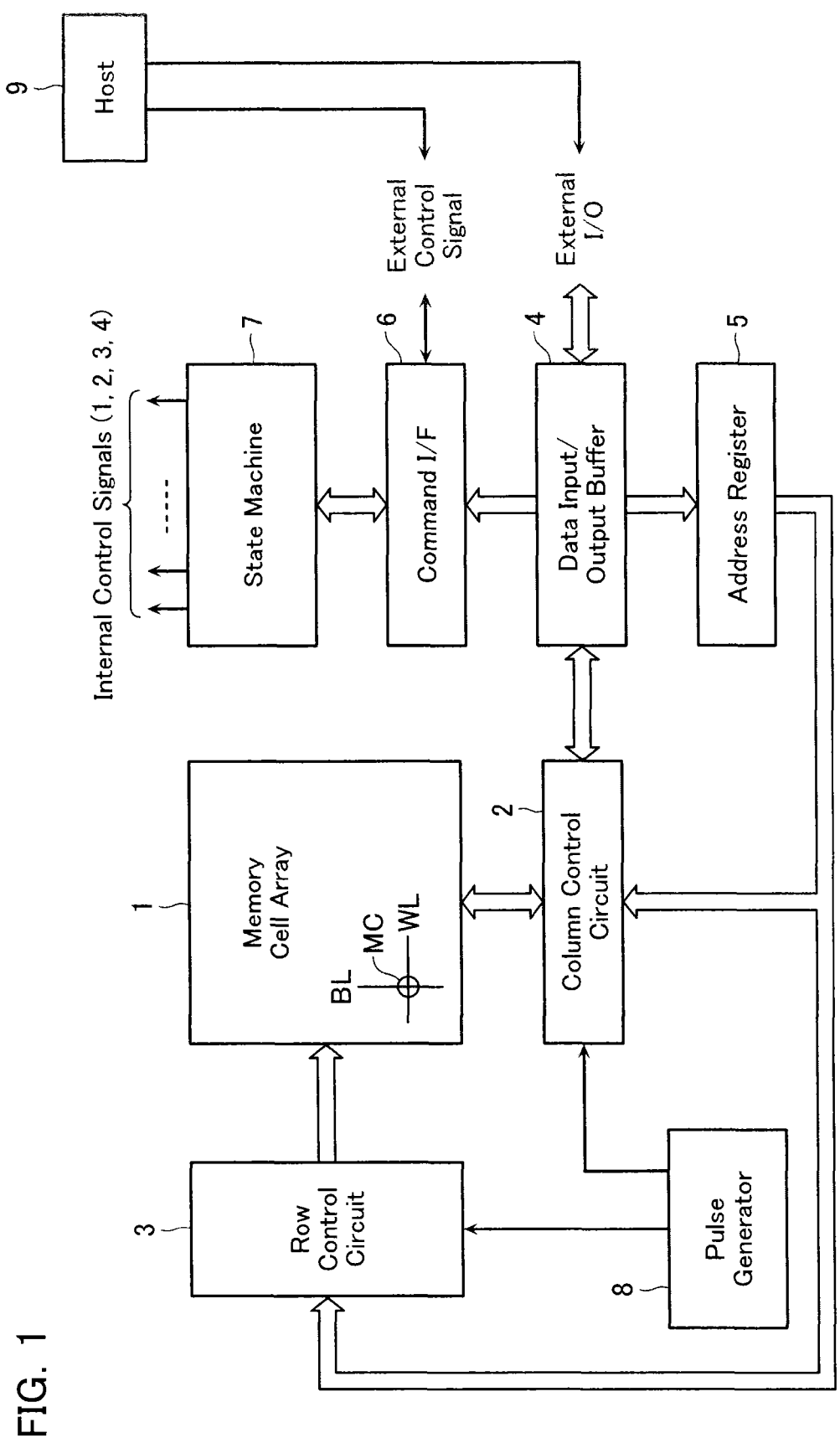
FIG. 1 is an overall block diagram of a semiconductor memory device according to a first embodiment.

First, a first embodiment will be described with reference to FIGS. 1 to 7. FIG. 1 is a block diagram showing a configuration of a nonvolatile semiconductor memory device according to the first embodiment. The present semiconductor memory device is a NAND type flash memory adopting an eight-level storage system. The present semiconductor memory device comprises a memory cell array 1 having a plurality of data-storing memory cells MC disposed in a matrix therein. The memory cell array 1 includes a plurality of bit lines BL and a plurality of word lines WL that intersect each other, and has the memory cell MC disposed at each of intersections of said bit lines BL and word lines WL. The memory cell MC has a stacked structure of a floating gate electrode which functions as a charge accumulation layer that accumulates a charge, and a control gate electrode which is connected to the word line WL. The memory cell MC is configured capable of electrically rewriting data by injection or release of charge into/from the floating gate electrode.

Connected to the memory cell array 1 are a column control circuit 2 for controlling a voltage of the bit line BL, and a row control circuit 3 for controlling a voltage of the word line WL. The column control circuit 2 reads data from the memory cell MC via the bit line BL and performs write of data to the memory cell MC via the bit line BL. The row control circuit 3 applies a voltage for write, read, and erase of data, to a gate electrode of the memory cell MC, via the word line WL. In the present embodiment, the column control circuit 2 and the row control circuit 3 are an example of a control circuit that performs write control on the memory cell array 1.

Connected to the column control circuit 2 is a data input/output buffer 4. Data of the memory cell MC read by the column control circuit 2 is outputted to an external host 9 from a data input/output terminal (external I/O) via the data input/output buffer 4. Moreover, write data inputted to the data input/output terminal (external I/O) from the external host 9 is inputted to the column control circuit 2 via the data input/output buffer 4, and is written to a designated memory cell MC.

Connected to the data input/output buffer 4 are an address register 5 and a command I/F 6. The address register 5 outputs address information inputted from the data input/output buffer 4, to the column control circuit 2 and the row control circuit 3. The command I/F 6 is connected to a state machine 7 and the external host 9, and sends/receives a control signal between these blocks. Connected to the state machine 7 are the memory cell array 1, the column control circuit 2, the row control circuit 3, and the data input/output buffer 4. The state machine 7 generates an internal control signal for controlling the memory cell array 1, the column control circuit 2, the row control circuit 3, and the data input/output buffer 4, based on an external control signal inputted from the host 9 via the command I/F 6.

Figure 2:
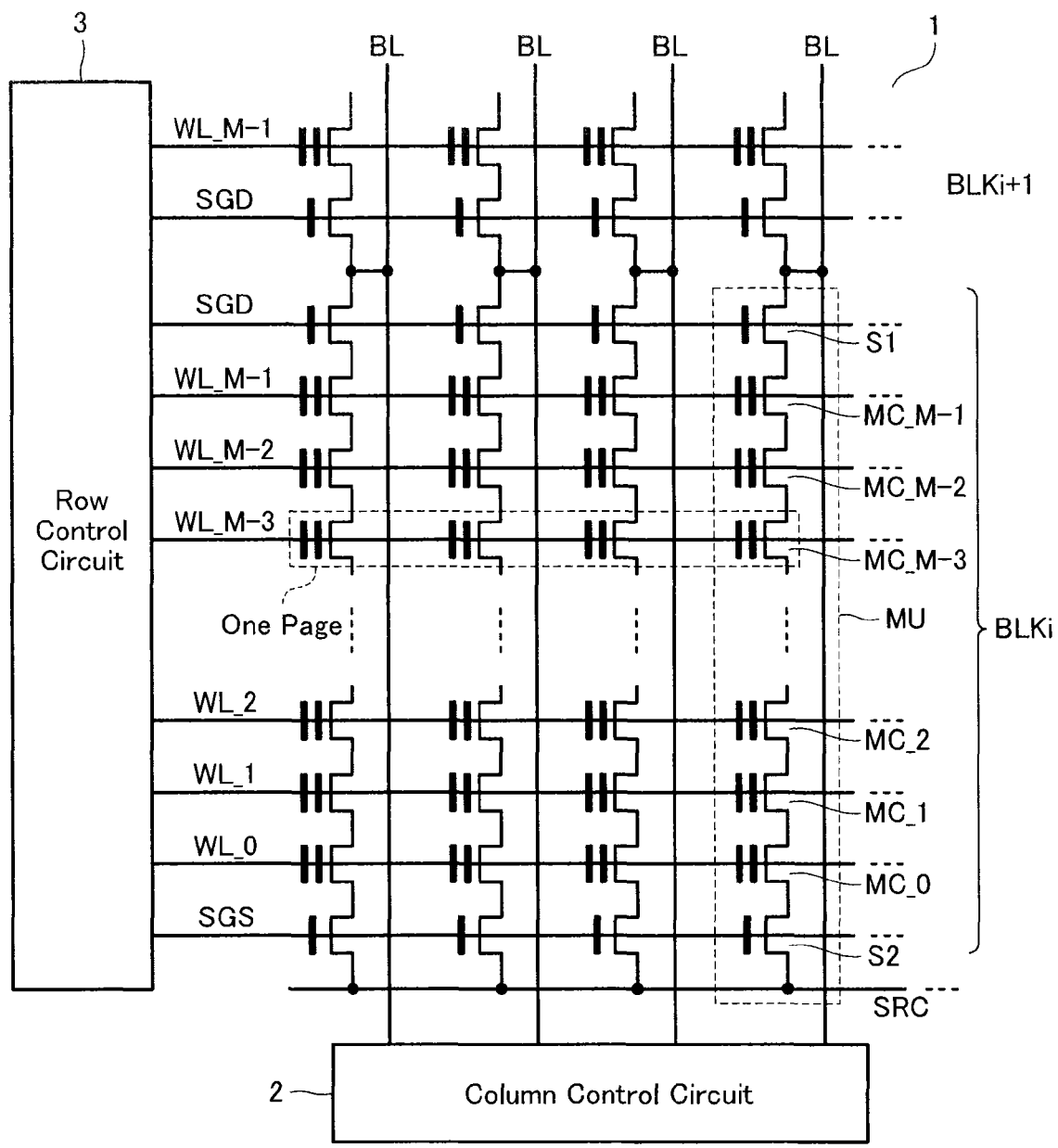
FIG. 2 is a circuit diagram showing a detailed configuration of a memory cell array.

FIG. 2 is a circuit diagram showing a configuration of a part of the memory cell array 1 shown in FIG. 1. The memory cell array 1 includes a plurality of memory units MU. The memory unit MU is configured from M (for example, M=16) memory cells MC_0 to MC_M−1 connected in series, and a first select gate transistor S1 and a second select gate transistor S2 connected to the two ends of these series-connected memory cells MC_0 to MC_M−1. One end of the first select gate transistor S1 is connected to the bit line BL, and one end of the second select gate transistor S2 is connected to a source line SRC. That is, the memory cells MC are arranged in series sandwiched by a plurality of select transistors (S1 and S2), at a region of intersection of the word line WL and the bit line BL.

Word lines WL_0 to WL_M−1 are connected to the control gate electrodes of the memory cells MC_0 to MC_M−1. The plurality of memory units MU are disposed in a direction of formation of the word line WL, and form one block BLKi. In the memory cell array 1, erase of data is performed in a block BLK unit. Moreover, the plurality of memory cells MC commonly connected to one word line WL (reference symbol PG) forms one page or a plurality of pages. In the memory cell array 1, write and read of data is performed simultaneously on the memory cells along one word line.

Figure 3:
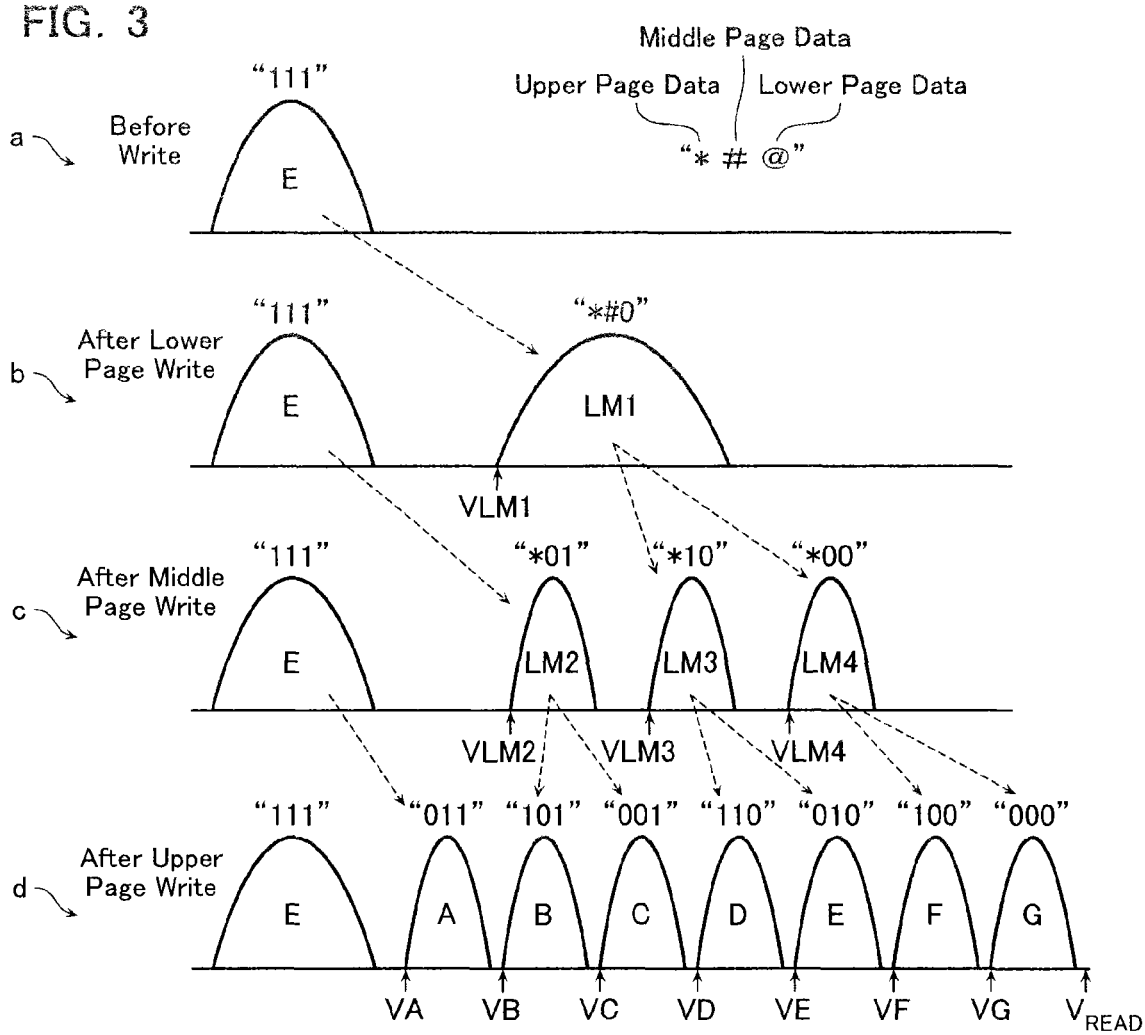
FIG. 3 includes schematic views showing threshold voltages of a memory cell during data write.

Next, an outline of a data storage system of the semiconductor memory device will be described. The semiconductor memory device according to the present embodiment is configured such that a threshold voltage of the memory cell MC can have eight kinds of distributions. FIG. 3, in a to d thereof, includes views showing a relationship between change in a threshold voltage distribution of the memory cell MC and three-bit eight-level data stored in the memory cell MC during data write of the nonvolatile semiconductor memory device. The eight-level data are specified by, for example, a negative threshold voltage distribution (erase distribution) Er having a lowest level of voltage level, and threshold voltage distributions A, B, C, D, E, F, and G having higher voltage levels than that of the threshold voltage distribution Er. In the present embodiment, the threshold voltage distributions Er and A to G are assumed to correspond to data in the following way, namely Er="111", A="011", B="101", C="001", D="110", E="010", F="100", and G="000" (refer to d of FIG. 3).

First, as shown in a of FIG. 3, before write, the memory cells included in the write-target block (refer to BLKi of FIG. 2) are all set to the erase state threshold voltage distribution (Er) by data erase. This data erase is performed by, for example, applying a positive erase voltage (Vera, not illustrated in FIG. 3) to a well where the memory cell array 1 is formed, and setting a potential of all word lines WL of the selected block to 0 V, thereby releasing electrons from the floating gates of all memory cells.

Next, as shown in b of FIG. 3, some of the memory cells in the erase state (Er) undergo a lower page write (Lower Page Program) that raises their threshold voltage to an intermediate voltage distribution (LM1). Then, a verify operation for verifying completion of the lower page write is performed by setting a verify voltage to a voltage VLM1 and applying said voltage between the gate and the source of the memory cell. If the memory cell conducts due to the verify voltage VLM1, then write fail (FAIL) is determined, and if the memory cell does not conduct due to the verify voltage VLM1, then write pass (PASS) is determined. As a result, the threshold voltage of the memory cell that has undergone the lower page write rises and undergoes transition to the intermediate threshold voltage distribution (LM1).

Next, as shown in c of FIG. 3, a middle page write (Middle Page Program) is performed that raises some of the memory cells in the erase state (Er) to an intermediate voltage distribution LM2 and causes the memory cell in the threshold voltage distribution LM1 to undergo transition to intermediate voltage distributions LM3 or LM4. Then, similarly to in the case of the lower page write, a verify operation for verifying completion of the middle page write is performed by setting a verify voltage to, respectively, VLM2, VLM3, and VLM4 and applying said voltage between the gate and the source of the memory cell. As a result, the threshold voltage of the memory cell that has undergone the middle page write rises and undergoes transition to any one of the threshold voltage distributions LM2, LM3, and LM4.

Next, as shown in d of FIG. 3, an upper page write (Upper Page Program) is performed that raises some of the memory cells in the erase state (Er) to the threshold voltage distribution A and causes the memory cell in the intermediate voltage distributions LM2 to LM4 to undergo transition to any one of the threshold voltage distributions B to G. More specifically, the threshold voltage distributions B and C are generated from the threshold voltage distribution LM2, the threshold voltage distributions D and E are generated from the threshold voltage distribution LM3, and the threshold voltage distributions F and G are generated from the threshold voltage distribution LM4. Then, a verify operation for verifying completion of the upper page write is performed by setting a verify voltage to, respectively, VA to VG and applying said voltage between the gate and the source of the memory cell. As a result, the threshold voltage of the memory cell that has undergone the upper page write rises and undergoes transition to any one of the threshold voltage distributions A to G.

In the above data write operation, a selected word line to which a write-target memory cell MC is connected is provided with a write voltage VPGM (about 20 to 28 V), and another unselected word line is provided with a write pass voltage Vpass (about 8 to 10 V). On that basis, depending on write data, the bit line to which the write-target memory cell MC is electrically connected is selectively provided with a ground voltage Vss (in the case of "0" write) or a power supply voltage VDD (in the case of "1" write). As a result, electrons are selectively injected into the floating gate of the memory cell MC.

In the case of "0" write that raises the threshold voltage, the ground voltage Vss provided to the bit line is transmitted to a channel of the NAND cell unit via the first select gate transistor S1 set to a conductive state. As a result, when the write voltage VPGM is provided, a tunnel current flows between the channel and the floating gate, and electrons are injected into the floating gate. On the other hand, in the case of "1" write that does not raise the threshold voltage (write inhibit), the bit line is provided with the power supply voltage VDD. In this state, even if the power supply voltage VDD is provided to the first select gate transistor S1, the channel of the NAND cell unit is charged to VDD-Vt (Vt is the threshold voltage of the first select gate transistor S1) to be in a floating state. As a result, when the write voltage VPGM is provided, the cell channel is boosted by capacitive coupling, and electron injection into the floating gate does not occur.

During read of data, read voltages (not illustrated) which are voltages between upper limits and lower limits of each of the threshold voltage distributions Er and A to G are applied between the gate and the source of the read-target selected memory cell MC. Moreover, a read pass voltage $V_{READ}$ (refer to d of FIG. 3) which is larger than the upper limit of the threshold voltage distribution G is applied between the gate and the source of a non-read-target unselected memory cell MC. The read pass voltage $V_{READ}$ is a voltage that has a value larger than that of the upper limit of the threshold voltage distribution G and that enables the memory cell MC to be set to a conductive state irrespective of held data of the memory cell MC.

As described above, the threshold voltage distribution of the write-completed memory cell MC eventually becomes any one of Er, A, B, C, D, E, F, and G (refer to d of FIG. 3). As previously mentioned, these threshold voltage distributions correspond to data "111(Er)", "011(A)", "101(B)", "001(C)", "110(D)", "010(E)", "100(F)", and "000(G)", respectively. That is, three-bit data of one memory cell MC is configured from lower page data, middle page data, and upper page data. When notated as data "*#@", "*" represents the upper page data, "#" represents the middle page data, and "@" represents the lower page data.

Figure 4:
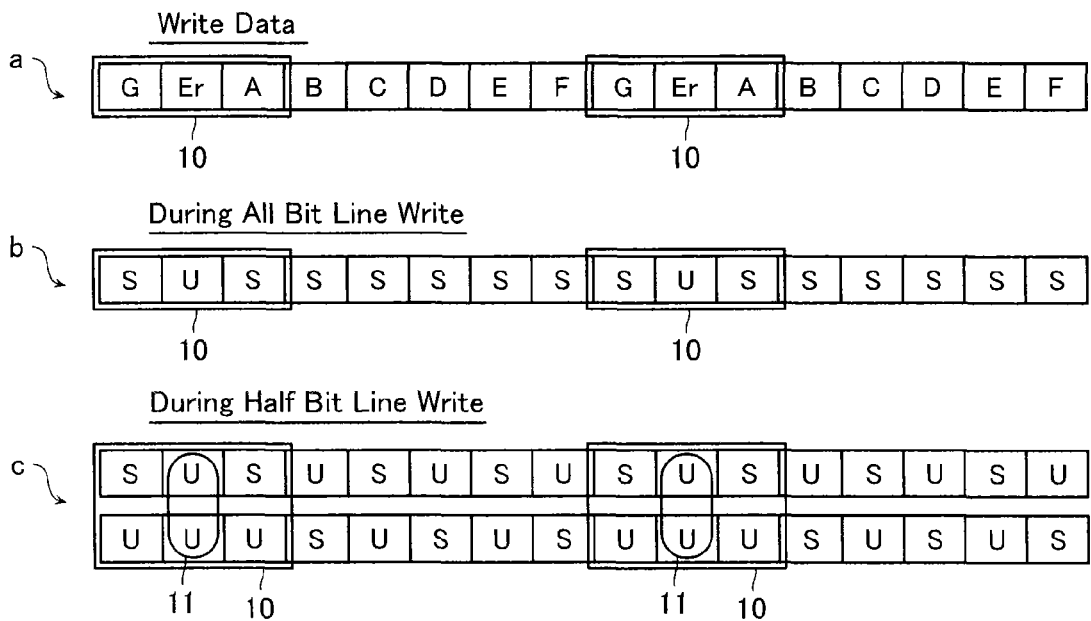
FIG. 4 includes schematic views showing a general data write method in a NAND type memory cell.

FIG. 4, in a to c thereof, includes schematic views showing a general data write method in a NAND type flash memory. Shown in a of FIG. 4 is a view of data intended to be written to the memory cells. Each box in FIG. 4 indicates the plurality of memory cells connected to the selected word line, and the alphabet letters in the boxes indicate the threshold voltage distributions (Er and A to G) corresponding to data to be written to the memory cells. In a of FIG. 4, a region indicated by reference symbol 10 includes a write-target memory cell whose threshold voltage is to be the erase state (Er) (referred to below as "erase-target cells"). Furthermore, in a of FIG. 4, the memory cells adjacent on both sides to the erase-target cell Er are memory cells that are not erase-target cells (G and A).

Shown in b of FIG. 4 is a view of the case of writing data to all of the memory cells along one word line at one time (referred to below as "all bit line system"). The alphabet letters written in each of the memory cells indicate selection (S: Selected) or unselection (U: Unselected) of the bit lines electrically connected to said memory cells. The selected bit line indicated by S is applied with the ground voltage (VSS). As a result, the voltage provided to the selected bit line is transmitted to the channel of the NAND cell unit via the first select gate transistor S1 set to a conductive state. As a result, when the write voltage VPGM is provided, a tunnel current flows between the channel and the floating gate, and electrons are injected into the floating gate.

On the other hand, the unselected bit line indicated by U is provided with the power supply voltage VDD. In this state, even if the power supply voltage VDD is provided to the first select gate transistor S1, the channel of the NAND cell unit is charged to VDD-Vt (Vt is the threshold voltage of the first select gate transistor S1) to be in a floating state. As a result, when the write voltage VPGM is provided, the cell channel is boosted by capacitive coupling, and electron injection into the floating gate does not occur.

Shown in c of FIG. 4 is a view of the case of performing write of data divided into two times (referred to below as "half bit line system"). First, as shown in the upper tier of c of FIG. 4, the bit lines connected to the memory cells that are odd-numbered from the left are selected bit lines (S), and the bit lines connected to the memory cells that are even-numbered from the left are unselected bit lines (U). Next, as shown in the lower tier of c of FIG. 4, the bit lines connected to the memory cells that are odd-numbered from the left are unselected bit lines (U), and the bit lines connected to the memory cells that are even-numbered from the left are selected bit lines (S).

In this way, in the half bit line system, selection and unselection of the bit line are inverted in the initial write operation (referred to below as "first write") and the second time of write operation (referred to below as "second write"). Moreover, the bit line electrically connected to the erase-target cell Er is maintained unselected (U) throughout the first write operation and the second write operation. The selected bit lines in the first write (referred to below as "first bit lines") and the selected bit lines in the second write (referred to below as "second bit lines") are disposed alternately corresponding to a disposition of the memory cells connected to a common word line. As a result of the half bit line system, voltage interference between adjacent bit lines during write can be suppressed compared to in a single-stage write system.

Now, in both the all bit line system shown in b of FIG. 4 and the half bit line system shown in c of FIG. 4, there occurs a state where, centered around the erase-target cell Er of the region surrounded by the reference symbol 10, the unselected bit line (U) is sandwiched by the selected bit lines (S).

Figure 5:
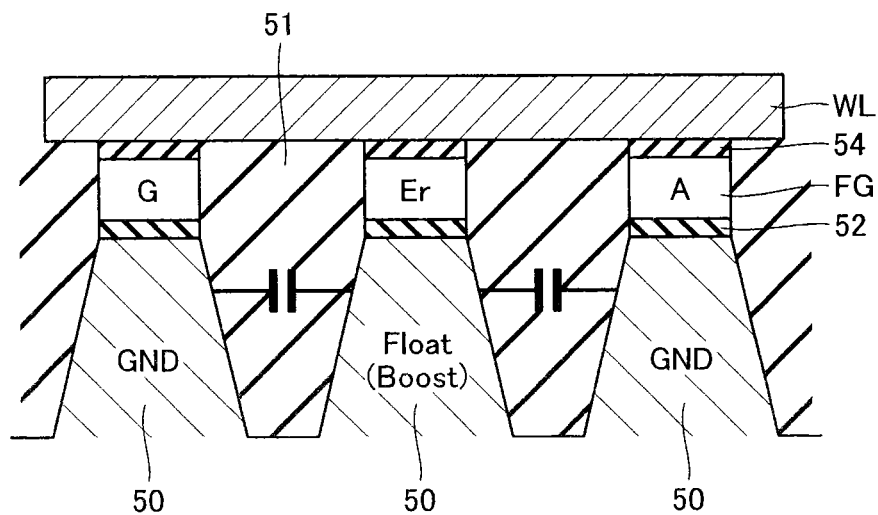
FIG. 5 is a cross-sectional schematic view showing a configuration of a memory cell.

FIG. 5 is a cross-sectional schematic view showing a configuration of the memory cells corresponding to the region 10. A substrate 50 shaped substantially in an upwardly projecting comb shape has formed thereon a structure in which a tunnel insulating film 52, a floating gate FG, and an insulating film 54 are sequentially stacked, and has a word line WL further formed commonly on said structure. The alphabet letters in the floating gate FG indicate the threshold voltage distribution of the write data. The substrate 50 is electrically connected to the bit line not illustrated, and a vicinity of a surface of the substrate 50 configures a channel region.

As shown in FIG. 5, a region of the substrate 50 corresponding to the erase-target cell (Er) is in a floating state due to the unselected bit line (U). On the other hand, regions corresponding to the memory cells (G and A) adjacent on both sides to the erase-target cell are at a ground potential (GND) due to the selected bit line (S). As a result, sometimes, due to capacitive coupling occurring between the channel region corresponding to the erase-target cell and the channel regions adjacent on both sides thereto, a potential of the channel region corresponding to the erase-target cell falls (Boost) and a miswrite gets performed.

Figure 6:
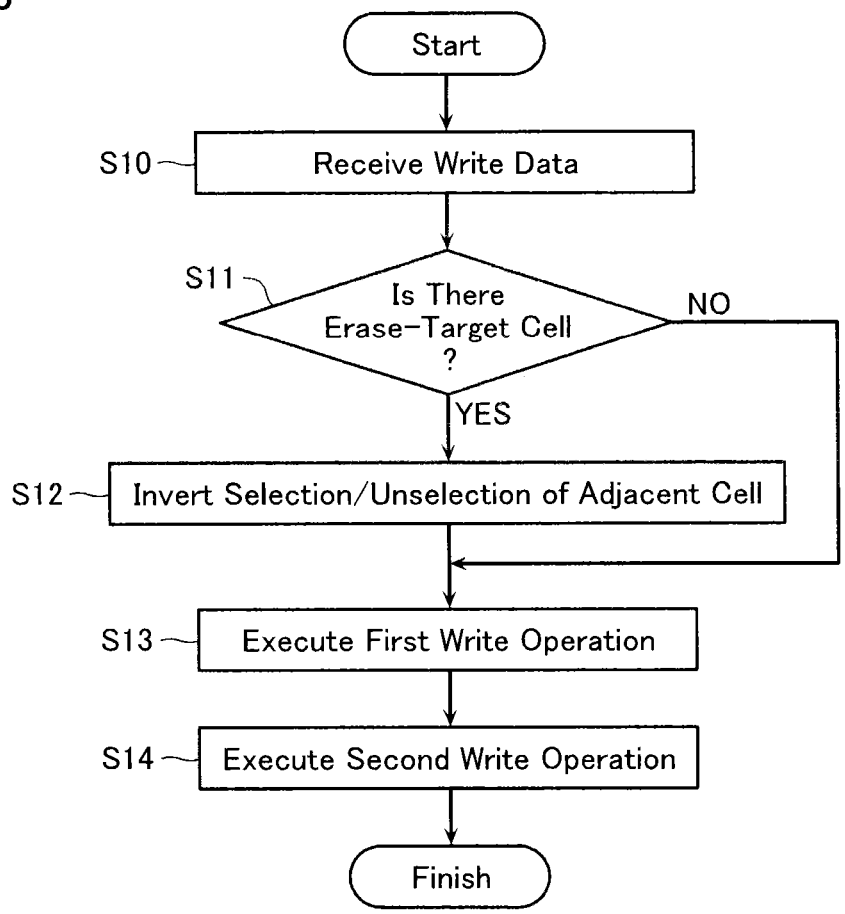
FIG. 6 is a flowchart showing a data write method of the semiconductor memory device according to the first embodiment.

FIG. 6 is a flowchart showing a write method of the semiconductor memory device according to the first embodiment. First, the control circuit including the column control circuit 2 and the row control circuit 3 of FIG. 1 receives write data (step S10). Next, the control circuit executes a determining operation that determines whether the write-target memory cells include an erase-target cell whose threshold voltage distribution after write is to be Er, or not (step S11).

If an erase-target cell is present (step S11=YES), then the control circuit executes an inverting operation that inverts selection or unselection of the bit line connected to one of the two memory cells adjacent to the erase-target cell, in the first write operation and the second write operation (step S12).

Said inverting operation will be described in detail by FIG. 7. Then, the control circuit executes the first write operation (step S13) and the second write operation (step S14). If an erase-target cell is not present (step S11=NO), then the control circuit executes the first write operation (step S13) and the second write operation (step S14) without performing the inverting operation of step S12.

Figure 7:
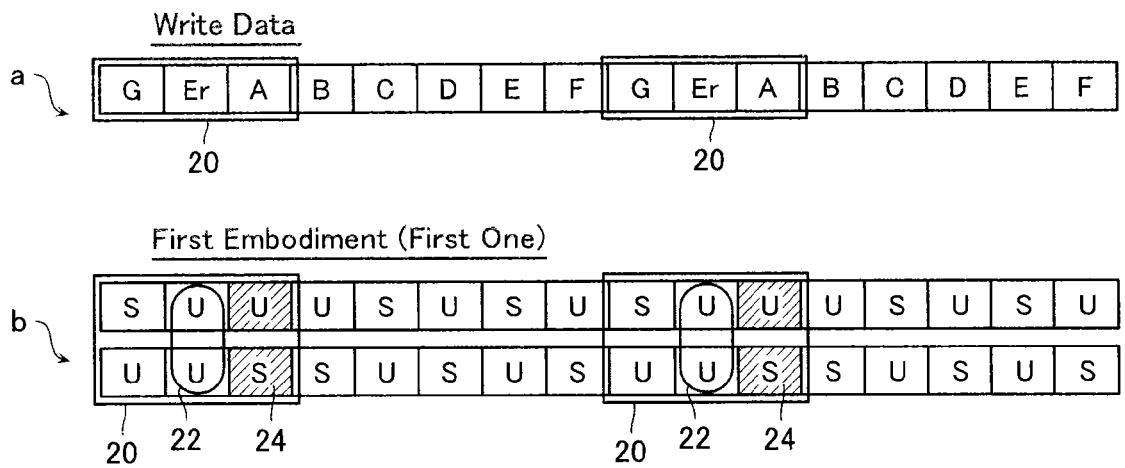
FIG. 7 includes (first) schematic views showing the data write method of the semiconductor memory device according to the first embodiment.

FIG. 7, in a to b thereof, includes (first) schematic views showing the data write method of the semiconductor memory device according to the first embodiment. Similarly to as described by FIG. 4, a of FIG. 7 is a view showing data intended to be written to the memory cell, and b of FIG. 7 is a view showing selection (S) or unselection (U) of the bit line electrically connected to the memory cell. As shown in a of FIG. 7, in FIG. 7, the second and tenth memory cells from the left are erase-target cells Er.

In the first write operation shown in the upper tier of b of FIG. 7 (step S13 of FIG. 6), the first bit lines connected to the memory cells that are odd-numbered from the left are selected bit lines (S), and the second bit lines connected to the memory cells that are even-numbered from the left are unselected bit lines (U) Next, in the second write operation shown in the lower tier of b of FIG. 7 (step S14 of FIG. 6), the first bit lines connected to the memory cells that are odd-numbered from the left are unselected bit lines (U), and the second bit lines connected to the memory cells that are even-numbered from the left are selected bit lines (S). In this way, in the first embodiment too, the first bit lines and the second bit lines are disposed alternately corresponding to a disposition of the memory cells connected to a common word line. Moreover, the bit line electrically connected to the erase-target cell Er is maintained unselected (U) throughout the first write operation and the second write operation.

Now, the bit line (24) connected to one of the memory cells adjacent to the erase-target cell (22) in the region including the erase-target cell Er surrounded by reference symbol 20 has its order of selection and unselection switched by the inverting operation (step S12 of FIG. 6). That is, the bit line corresponding to the reference symbol 24 is unselected (U) in the first write operation and selected (S) in the second write operation, in spite of being a first bit line which is odd-numbered from the left. As a result, in the region 20, one of the bit lines corresponding to the memory cells adjacent to the erase-target cell 22 is unselected (U) throughout the first write operation and the second write operation. Therefore, contrary to the case of FIG. 4, there ceases to occur a state where the unselected bit line (U) connected to the erase-target cell is sandwiched by two selected bit lines (S).

Figure 8:
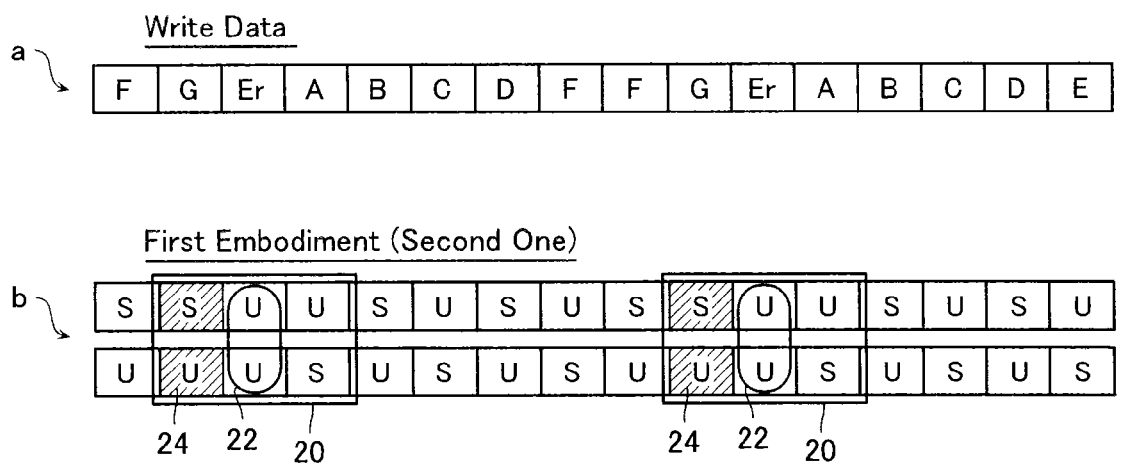
FIG. 8 includes (second) schematic views showing the data write method of the semiconductor memory device according to the first embodiment.

FIG. 8, in a to b thereof, includes (second) schematic views showing the data write method of the semiconductor memory device according to the first embodiment. As shown in a of FIG. 8, in FIG. 8, the third and eleventh memory cells from the left are erase-target cells Er. In b of FIG. 8, similarly to in b of FIG. 7, the first bit lines which are odd-numbered from the left change from the selected bit line (S) in the first write operation to the unselected bit line (U) in the second write operation, and the second bit lines which are even-numbered from the left change from the unselected bit line (U) in the first write operation to the selected bit line (S) in the second write operation. The bit line electrically connected to the erase-target cell Er is maintained unselected (U) throughout the first write operation and the second write operation.

Now, the bit line connected to one (24) of the memory cells adjacent to the erase-target cell 22 in the region including the erase-target cell surrounded by reference symbol 20 has its order of selection (S) and unselection (U) switched by the inverting operation (step S12 of FIG. 6). That is, the bit line corresponding to the reference symbol 24 is selected (S) in the first write operation and unselected (U) in the second write operation, in spite of being a second bit line which is even-numbered from the left. As a result, in the region 20, one of the bit lines corresponding to the memory cells adjacent to the erase-target cell 22 is unselected (U) throughout the first write operation and the second write operation. Therefore, contrary to the case of FIG. 4, there ceases to occur a state where the unselected bit line (U) connected to the erase-target cell is sandwiched by two selected bit lines (S).

As described above, due to the semiconductor memory device according to the first embodiment, performing the inverting operation (step S12 of FIG. 6) in the case where the write-target memory cells include an erase-target cell prevents occurrence of a state where the erase-target cell is sandwiched by two selected bit lines. As a result, the voltage drop (Boost) of the channel region accompanying the capacitive coupling described in FIG. 5 can be suppressed, and miswrite to the erase-target cell can be suppressed. As a result, interference of voltages between adjacent bit lines can be suppressed, and reliability of operation during data write can be increased.

Second Embodiment

Next, a second embodiment will be described with reference to FIGS. 9 to 10. A semiconductor memory device according to the second embodiment has a configuration and a data storage system that are the same as those of the first embodiment (FIGS. 1 to 3), but has a write operation procedure that differs from that of the first embodiment. Specifically, the second embodiment is configured to not perform the inverting operation if the memory cell adjacent to the erase-target cell is an erase-target cell. This will be described in detail below.

Figure 9:
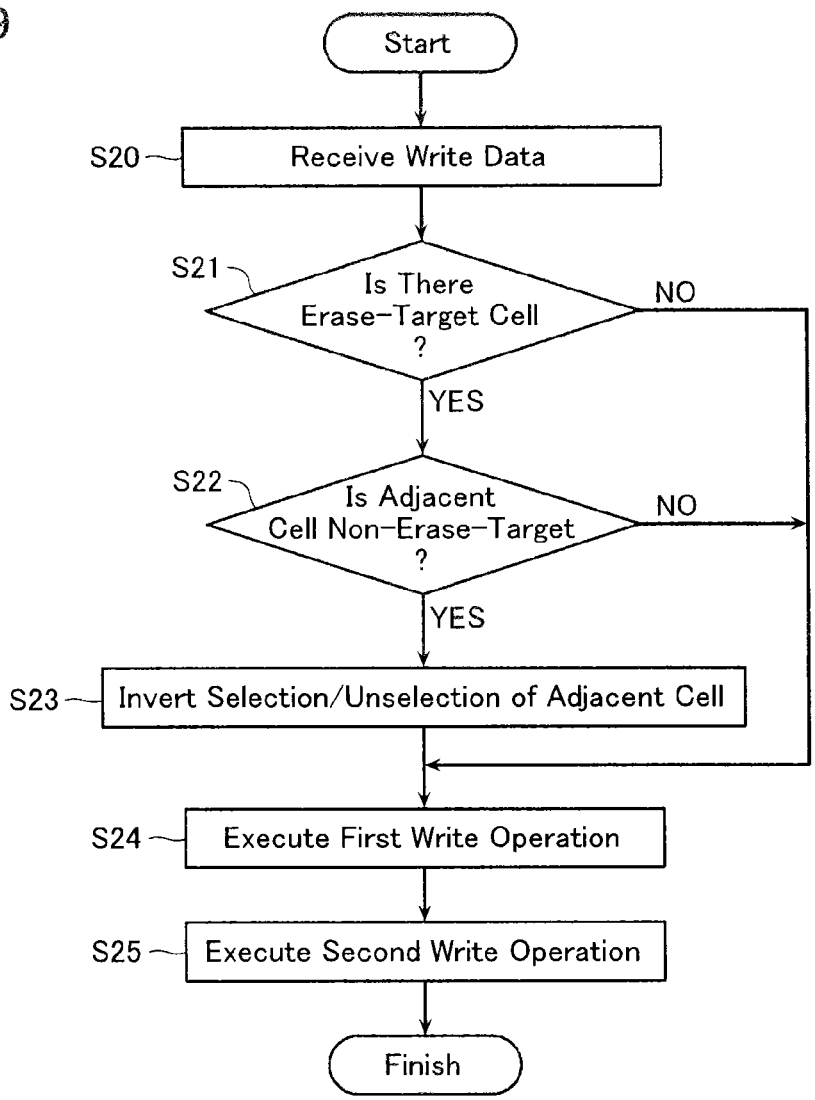
FIG. 9 is a flowchart showing a data write method of a semiconductor memory device according to a second embodiment.

FIG. 9 is a flowchart showing a write method of the semiconductor memory device according to the second embodiment. First, the control circuit receives write data (step S20). Next, the control circuit executes a determining operation that determines whether the write-target memory cells include an erase-target cell whose threshold voltage distribution after write is to be Er, or not (step S21).

If an erase-target cell is present (step S21=YES), then the control circuit determines whether the memory cell adjacent to the erase-target cell identified in step S21 is a non-erase-target cell, or not (step S22). If it is determined in step S22 that the adjacent memory cell is a non-erase-target cell (step S22=YES), then the control circuit executes an inverting operation similar to that described in the first embodiment (step S23). Then, the control circuit executes the first write operation (step S24) and the second write operation (step S25).

On the other hand, if an erase-target cell is not present (step S21=NO), or if an erase-target cell is present but the memory cell adjacent thereto is an erase-target cell (step S22=NO), then the control circuit does not perform the inverting operation of step S23. In this case, the control circuit executes the first write operation (step S24) and the second write operation (step S25) without inverting selection and unselection of the bit line.

Figure 10:
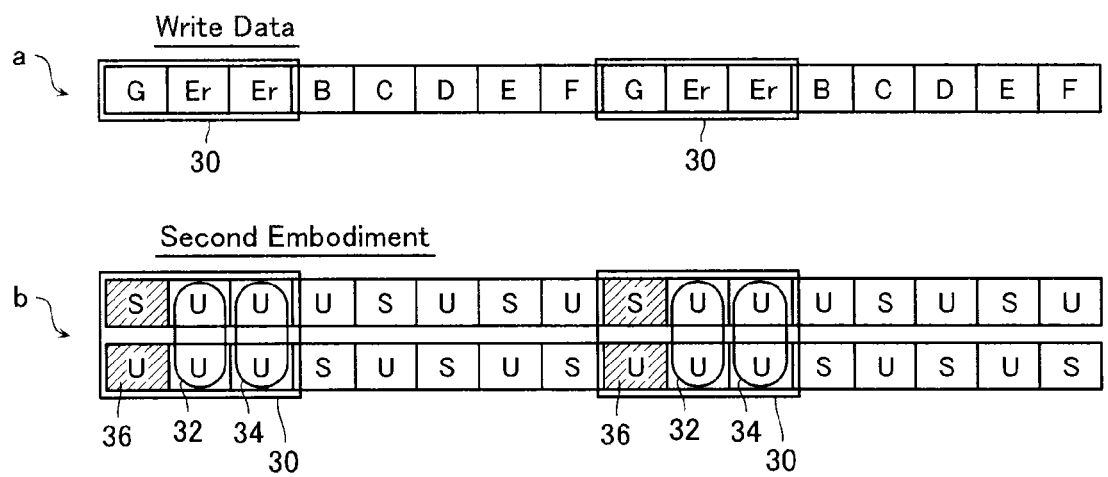
FIG. 10 includes schematic views showing the data write method of the semiconductor memory device according to the second embodiment.

FIG. 10, in a to b thereof, includes schematic views showing the data write method of the semiconductor memory device according to the second embodiment, and a detailed description of portions shared with the first embodiment (FIGS. 7 to 8) will be omitted. As shown in a of FIG. 10, in a region surrounded by reference symbol 30, one of the memory cells adjacent to the erase-target cell Er is an erase-target cell Er. Moreover, in the first write operation and the second write operation, the first bit lines which are odd-numbered from the left change from the selected bit line (S) to the unselected bit line (U), and the second bit lines which are even-numbered from the left change from the unselected bit line (U) to the selected bit line (S). In this way, in the second embodiment too, the first bit lines and the second bit lines are disposed alternately corresponding to a disposition of the memory cells connected to a common word line.

In the first write operation shown in the upper tier of b of FIG. 10, the memory cell 34 adjacent to the erase-target cell 32 is also an erase-target cell. Therefore, the memory cell 36 adjacent to the erase-target cell 32 and determined NO in step S22 of FIG. 9 does not undergo inversion of the bit lines. As a result, the bit line corresponding to the memory cell is selected (S) in the first write operation and unselected (U) in the second write operation, according to principle.

As described above, in the semiconductor memory device according to the second embodiment, there is a configuration in which if the memory cell adjacent to the erase-target cell is an erase-target cell (if two erase-target cells are aligned), then the inverting operation of the bit lines is omitted. As shown in b of FIG. 10, if the memory cell adjacent to the erase-target cell is an erase-target cell, then the phenomenon of the erase-target cell being sandwiched by two selected bit lines (S) does not occur, even if the inverting operation of the bit lines is not performed. In such a case, by configuring to not perform the inverting operation of the bit lines, a step of the write operation can be omitted and the write operation can be efficiently performed.

Third Embodiment

Next, a third embodiment will be described with reference to FIGS. 11 to 12. A semiconductor memory device according to the third embodiment has a configuration and a data storage system that are the same as those of the first embodiment (FIGS. 1 to 3), but has a write operation procedure that differs from that of the first embodiment. Specifically, the third embodiment is configured to determine whether to perform the inverting operation or not, based on the threshold voltage distribution corresponding to write data of the memory cells adjacent to the erase-target cell. This will be described in detail below.

Figure 11:
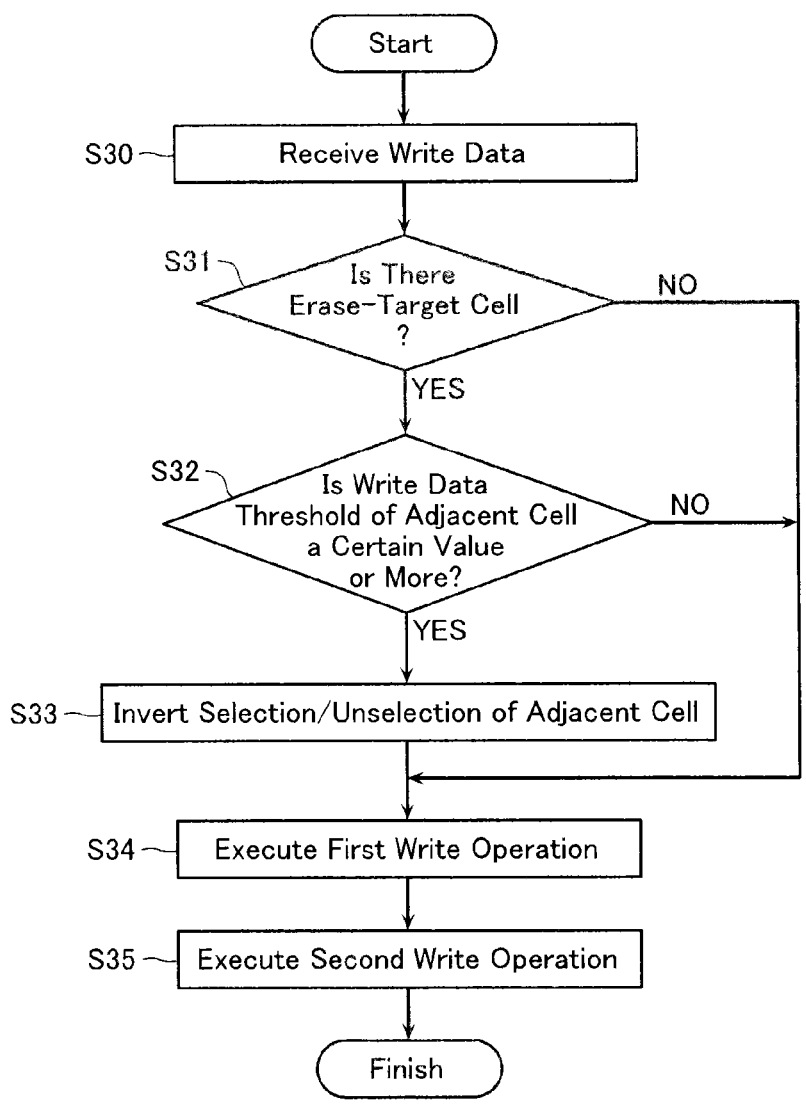
FIG. 11 is a flowchart showing a data write method of a semiconductor memory device according to a third embodiment.

FIG. 11 is a flowchart showing a write method of the semiconductor memory device according to the third embodiment. First, the control circuit receives write data (step S30). Next, the control circuit executes a determining operation that determines whether the write-target memory cells include an erase-target cell whose threshold voltage distribution after write is to be Er, or not (step S31).

If an erase-target cell is present (step S31=YES), then the control circuit determines whether write data of the memory cell adjacent to the erase-target cell identified in step S31 has its threshold voltage set to a certain value or more, or not (step S32). If it is determined in step S32 that the threshold voltage of the write data is the certain value or more (step S32=YES), then the control circuit executes an inverting operation similar to those described in the first through second embodiments (step S33). Then, the control circuit executes the first write operation (step S34) and the second write operation (step S35).

On the other hand, if an erase-target cell is not present (step S31=NO), or if an erase-target cell is present but the threshold voltage of the write data to the memory cell adjacent thereto is not the certain value or more (step S32=NO), then the control circuit does not perform the inverting operation of step S33. In this case, the control circuit executes the first write operation (step S34) and the second write operation (step S35) without inverting selection and unselection of the bit line.

Figure 12:
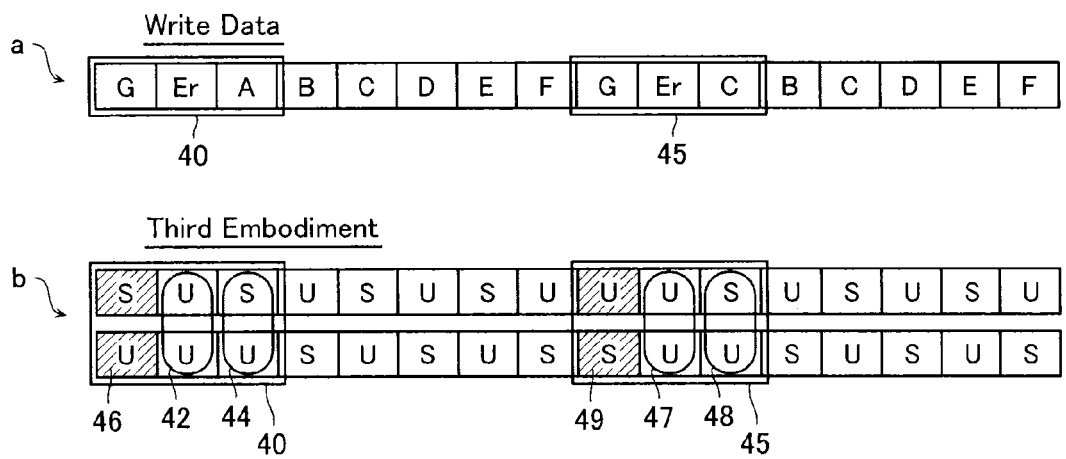
FIG. 12 includes schematic views showing the data write method of the semiconductor memory device according to the third embodiment.

FIG. 12, in a to b thereof, includes schematic views showing the data write method of the semiconductor memory device according to the third embodiment, and a detailed description of portions shared with the first embodiment (FIGS. 7 to 8) will be omitted. As shown in a of FIG. 12, in a region surrounded by reference symbol 40, write data of the memory cells adjacent to the erase-target cell Er are "G" and "A". Moreover, in a region surrounded by reference symbol 45, write data of the memory cells adjacent to the erase-target cell Er are "G" and "C".

In the present embodiment, in the first write operation and the second write operation, the first bit lines which are odd-numbered from the left change from the selected bit line (5) to the unselected bit line (U), and the second bit lines which are even-numbered from the left change from the unselected bit line (U) to the selected bit line (S). In this way, in the third embodiment too, the first bit lines and the second bit lines are disposed alternately corresponding to a disposition of the memory cells connected to a common word line. Moreover, the determining operation of step S32 of FIG. 11 is set such that NO is determined if the threshold value of write data is "A" or "B", and YES is determined if the threshold value of write data is another value (C to G).

In the first write operation shown in the upper tier of b of FIG. 12, write data of the memory cell 44 adjacent to the erase-target cell 42 in the region 40 is "A". Therefore, the memory cell 46 adjacent to the erase-target cell 42 and determined NO in step S32 of FIG. 11 does not undergo inversion of the bit lines. As a result, the bit line corresponding to the memory cell is selected (5) in the first write operation and unselected (U) in the second write operation, according to principle.

On the other hand, write data of the memory cells adjacent to the erase-target cell 47 in the region 45 are "G" and "C". Therefore, the memory cell 49 adjacent to the erase-target cell 47 and determined YES in step S32 of FIG. 11 does undergo inversion of the bit lines. As a result, the bit line corresponding to the memory cell 49 is unselected (U) in the first write operation and selected (S) in the second write operation, in spite of being a first bit line which is odd-numbered from the left.

As described above, in the semiconductor memory device according to the third embodiment, there is a configuration in which if the threshold voltage of write data of the memory cell adjacent to the erase-target cell is to be smaller than a certain value, then the inverting operation of the bit lines is omitted. This is because if the threshold voltage of write data is small, the write-target memory cell achieves write inhibit ("1" write) at an early stage of write, hence an effect of capacitive coupling on adjacent memory cells is thought to be small. In such a case, by configuring to not perform the inverting operation of the bit lines, a step of the write operation can be omitted and the write operation can be efficiently performed.

The first through third embodiments were described taking as an example a memory cell capable of eight-level storage, but the above-described embodiments may be similarly applied to any memory cell capable of multi-level storage (of four or more levels). However, when stored data is of eight or more levels, the problem of capacitive coupling in the erase-target cell during write becomes greater due to the threshold voltage distributions narrowing. Therefore, the first through third embodiments are particularly preferred in a memory cell capable of storing data of eight or more levels.

OTHER EMBODIMENTS

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a plurality of memory cells that have a threshold voltage included in any of four or more kinds of threshold voltage distributions including an erase state, and that are configured to be capable of storing four or more levels of data;
    a word line commonly connected to the plurality of memory cells;
    a plurality of first bit lines and a plurality of second bit lines that are electrically connected respectively to the plurality of memory cells and that are disposed alternately corresponding to arrangement of the plurality of memory cells; and
    a control circuit capable of executing a first write operation that selects the first bit line and does not select the second bit line and performs write of data to the memory cell connected to the first bit line and does not perform write of data to the memory cell connected to the second bit line, and a second write operation that selects the second bit line and does not select the first bit line and performs write of data to the memory cell connected to the second bit line and does not perform write of data to the memory cell connected to the first bit line,
    the control circuit being capable of executing:
        a determining operation that determines whether the memory cell which is to be a write-target includes an erase-target cell whose threshold voltage is to be the erase state, or not; and
        an inverting operation that inverts selection or unselection of the bit line connected to one of the two memory cells adjacent to the erase-target cell, in the first write operation and in the second write operation.

2. The semiconductor memory device according to claim 1, wherein
    the control circuit omits the inverting operation in the case that either of the memory cells positioned adjacently on both sides of the erase-target cell is an erase-target cell.

3. The semiconductor memory device according to claim 1, wherein
    the control circuit omits the inverting operation in the case that either of the memory cells positioned adjacently on both sides of the erase-target cell is a memory cell whose threshold voltage after data write is to be smaller than a certain value.

4. The semiconductor memory device according to claim 1, wherein
    the memory cell has a threshold voltage included in any of eight or more kinds of threshold voltage distributions including the erase state, and is configured to be capable of storing eight or more levels of data.

5. The semiconductor memory device according to claim 1, further comprising:
    a NAND cell unit including a plurality of the memory cells connected in series therein,
    wherein one end of the NAND cell unit is connected to one of the first bit lines and the second bit lines via one select transistor, and the other end of the NAND cell unit is connected to a source line via another select transistor.

6. The semiconductor memory device according to claim 5, wherein
    the control circuit omits the inverting operation in the case that either of the memory cells positioned adjacently on both sides of the erase-target cell is an erase-target cell.

7. The semiconductor memory device according to claim 5, wherein
    the control circuit omits the inverting operation in the case that either of the memory cells positioned adjacently on both sides of the erase-target cell is a memory cell whose threshold voltage after data write is to be smaller than a certain value.

8. The semiconductor memory device according to claim 5, wherein
    the memory cell has a threshold voltage included in any of eight or more kinds of threshold voltage distributions including the erase state, and is configured to be capable of storing eight or more levels of data.

9. A method of controlling a semiconductor memory device, the semiconductor memory device comprising a plurality of memory cells having a threshold voltage included in any of four or more kinds of threshold voltage distributions including an erase state and configured capable of storing four or more levels of data, a word line commonly connected to the plurality of memory cells, and a plurality of first bit lines and a plurality of second bit lines electrically connected respectively to the plurality of memory cells and disposed alternately corresponding to arrangement of the plurality of memory cells, the method comprising:
    executing a first write operation that selects the first bit line and does not select the second bit line and performs write of data to the memory cell connected to the first bit line and does not perform write of data to the memory cell connected to the second bit line, and a second write operation that selects the second bit line and does not select the first bit line and performs write of data to the memory cell connected to the second bit line and does not perform write of data to the memory cell connected to the first bit line;
    executing a determining operation that determines whether the memory cell which is to be a write-target includes an erase-target cell whose threshold voltage is to be the erase state or not; and
    executing an inverting operation that inverts selection or unselection of the bit line connected to one of the two memory cells adjacent to the erase-target cell in the first write operation and in the second write operation.

10. The method of controlling a semiconductor memory device according to claim 9, further comprising:
    omitting the inverting operation in the case that either of the memory cells positioned adjacently on both sides of the erase-target cell is an erase-target cell.

11. The method of controlling a semiconductor memory device according to claim 9, further comprising:
    omitting the inverting operation in the case that either of the memory cells positioned adjacently on both sides of the erase-target cell is a memory cell whose threshold voltage after data write is to be smaller than a certain value.

12. The method of controlling a semiconductor memory device according to claim 9, wherein the memory cell has a threshold voltage included in any of eight or more kinds of threshold voltage distributions including the erase state, and is configured to be capable of storing eight or more levels of data.

13. The method of controlling a semiconductor memory device according to claim 9, wherein the semiconductor memory device further comprises a NAND cell unit including a plurality of the memory cells connected in series therein, and one end of the NAND cell unit is connected to one of the first bit lines and the second bit lines via one select transistor, and the other end of the NAND cell unit is connected to a source line via another select transistor.

14. The method of controlling a semiconductor memory device according to claim 13, further comprising:

omitting the inverting operation in the case that either of the memory cells positioned adjacently on both sides of the erase-target cell is an erase-target cell.

15. The method of controlling a semiconductor memory device according to claim 13, further comprising:

omitting the inverting operation in the case that either of the memory cells positioned adjacently on both sides of the erase-target cell is a memory cell whose threshold voltage after data write is to be smaller than a certain value.

16. The method of controlling a semiconductor memory device according to claim 13, wherein the memory cell has a threshold voltage included in any of eight or more kinds of threshold voltage distributions including the erase state, and is configured to be capable of storing eight or more levels of data.

* * * * *